(12) United States Patent
Wang

(10) Patent No.: US 9,665,412 B2
(45) Date of Patent: May 30, 2017

(54) PROGRAMMABLE LOGIC CONTROLLER AND EVENT-DRIVEN PROGRAMMING METHOD THEREOF

(71) Applicant: Haifeng Wang, Shanghai (CN)

(72) Inventor: Haifeng Wang, Shanghai (CN)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 0 days.

(21) Appl. No.: 14/439,422

(22) PCT Filed: Dec. 17, 2013

(86) PCT No.: PCT/CN2013/089723
§ 371 (c)(1),
(2) Date: Apr. 29, 2015

(87) PCT Pub. No.: WO2014/094605
PCT Pub. Date: Jun. 26, 2014

(65) Prior Publication Data
US 2015/0293796 A1    Oct. 15, 2015

(30) Foreign Application Priority Data
Dec. 19, 2012   (CN) .......................... 2012 1 0554616

(51) Int. Cl.
*G06F 9/54* (2006.01)
*G06F 17/50* (2006.01)
*G05B 19/05* (2006.01)

(52) U.S. Cl.
CPC ........... *G06F 9/542* (2013.01); *G05B 19/056* (2013.01); *G06F 9/546* (2013.01); *G06F 17/5054* (2013.01)

(58) Field of Classification Search
CPC .... G05B 19/05; G05B 19/052; G05B 19/054; G05B 19/056; G05B 19/058; G06F 9/542; G06F 9/546; G06F 17/5054
See application file for complete search history.

(56) References Cited

U.S. PATENT DOCUMENTS

| 5,771,374 A * | 6/1998 | Burshtein ............ G05B 19/054 |
| | | 700/11 |
| 2002/0165998 A1* | 11/2002 | Hrebejk .................. G06F 9/542 |
| | | 719/318 |

(Continued)

FOREIGN PATENT DOCUMENTS

| CN | 101377668 A | 3/2009 |
| EP | 0800668 A1 | 10/1997 |

(Continued)

OTHER PUBLICATIONS

International Preliminary Report on Patentability and Written Opinion of the International Searching Authority from corresponding PCT/CN2013/089723 dated Jun. 23, 2015.

(Continued)

*Primary Examiner* — Syed Roni
(74) *Attorney, Agent, or Firm* — Lando & Anastasi, LLP

(57) ABSTRACT

The present invention provides an event-driven programming method of programmable logic controller (PLC), including: registering at least one event to be detected; storing at least one event handler segment corresponding to the at least one event to be detected respectively; detecting the occurrence of the at least one event to be detected; adding the detected event into an event queue; extracting events from the event queue; and executing the event handler segment corresponding to the extracted event.

14 Claims, 3 Drawing Sheets

(56) References Cited

U.S. PATENT DOCUMENTS

| | | | |
|---|---|---|---|
| 2005/0198034 A1* | 9/2005 | Boyer | G05B 19/4183 |
| 2005/0229181 A1* | 10/2005 | Vazeille | G06F 9/542 |
| | | | 718/102 |
| 2007/0260470 A1* | 11/2007 | Bornhoevd | G06Q 10/08 |
| | | | 709/203 |
| 2010/0306001 A1 | 12/2010 | Discenzo et al. | |
| 2011/0173359 A1* | 7/2011 | Chakravarty | G06F 9/542 |
| | | | 710/112 |

FOREIGN PATENT DOCUMENTS

| | | |
|---|---|---|
| EP | 2515232 A1 | 10/2012 |
| RU | 83146 U1 | 5/2009 |
| RU | 101551 U1 | 1/2011 |

OTHER PUBLICATIONS

International Search Report from corresponding PCT/CN2013/089723 dated Mar. 20, 2014.

Chmiel Miroslaw et al: "Compact PLC with event-driven program tasks execution", 3rd IFAC Workshop on Discrete-Event System Design (2006)—Discrete-Event System Design, vol. #3, Part#1; Sep. 13, 2006-Sep. 15, 2006, University of Zielona Gora, Poland, vol. 3, No. 1, Jan. 1, 2006 (Jan. 1, 2006), pp. 99-104, XP008178742, DOI: 10.3182/20060926-3-PL-4904.00017, ISBN: 978-3-902661-63-0.

Extended European Search Report from corresponding European Application No. 13866266.3 dated Feb. 4, 2016.

J. Park et al: "Implementation of a parallel algorithm for event driven programmable controllers", Control Engineering Practice., vol. 1, No. 4, Aug. 1, 1993 (Aug. 1, 1993 ), pp. 663-670, XP055245127, GB, ISSN: 0967-0661, DOI: 10.1016/0967-0661(93)91390-I.

Russian Office Action issued by the Russian Patent Office from corresponding Russian Application No. 2015129090 dated Oct. 17, 2016 [English Translation attached].

Second Chinese Office Action from corresponding Chinese Application No. 201210554616.4 issued Aug. 31, 2016 [English Translation attached].

\* cited by examiner

PROGRAMMABLE LOGIC CONTROLLER AND EVENT-DRIVEN PROGRAMMING METHOD THEREOF

This application is the U.S. National Phase Application under 35 U.S.C. §371 of International Application No. PCT/CN2013/089723, filed Dec. 17, 2013, which claims priority to Chinese Patent Application No. CN201210554616.4, filed Dec. 19, 2012. These prior applications are incorporated by reference herein in their entirety.

BACKGROUND

The present invention relates to programmable logic controller, and more particularly, relates to event-driven programmable logic controller and event-driven programming method thereof.

Programmable logic controller (PLC) plays an important role in the field of industrial control due to its flexibility in being programmable by the user. The programming methods of the existing programmable logic controller and the corresponding user application programs are based on scan cycle. The scan cycle has several steps, comprising: updating the input value, executing the user application, and refreshing the output value.

However, programming methods according to scan cycle have the following disadvantages:

Slow response to event. The user needs to detect the input event in application program, and the response cannot be outputted until the end of scan cycle.

Complicated user applications which are not easy to write. For programmable logic controllers according to scan cycle, the user application is responsible for event detecting and handling.

Poor readability of user application, which makes it difficult to maintain. For programmable logic controller according to scan cycle, the user needs to integrate the processing procedure of various events such as input/output event, diagnostic event, system event and so on in a single program, therefore the user application is poorly structured.

SUMMARY

The present invention provides event-driven programmable logic controller and event-driven programming method thereof in respect to the above disadvantages of the existing programmable logic controller according to scan cycle and programming method thereof.

According to an aspect of the invention, provided is an event-driven programming method of programmable logic controller, comprising: registering at least one event to be detected; storing at least one event handler program section corresponding to the at least one event to be detected, respectively; detecting the occurrence of the at least one event to be detected; adding the detected event into an event queue; extracting an event from the event queue; executing an event handler program section corresponding to the extracted event.

According to an embodiment of the present invention, the at least one event to be detected may include an event selected from at least one predefined event by a user.

According to an embodiment of the present invention, the at least one event to be detected may include a user customized event inputted by the user.

According to an embodiment of the present invention, the user customized event may include a logical combination of the predefined event.

According to an embodiment of the present invention, the predefined event may include input/output event, communication event, diagnostic event, system error event, system idle event.

According to an embodiment of the present invention, the at least one event handler program section may include a predefined event handler program section.

According to an embodiment of the present invention, the at least one event handler program section may include a user customized event handler program section inputted by a user.

The method may further include replacing a corresponding predefined event handler program section by a user customized event handler program section.

According to an embodiment of the present invention, the event queue may include a plurality of event queues with different priority levels, the registering the at least one event to be detected may further include registering the priority level of the event to be detected, the adding the detected event into the event queue may include adding the event to be detected into a corresponding event queue according to the priority level of the event, the extracting an event from the event queue may include preferentially extracting an event from an event queue with a high priority level.

According to an embodiment of the present invention, the adding the detected event in the event queue may include discarding a detected event if the event is already in the event queue.

According to another aspect of the invention, provided is a programmable logic controller, comprising: an event queue for storing the events to be handled; an event detector for registering at least one event to be detected, detecting the occurrence of the at least one event to be detected, and adding the detected event into the event queue; a program memory for storing at least one event handler program section corresponding to the at least one event to be detected, respectively; an event dispatcher for extracting an event from the event queue; and an event handler for executing an event handler program section corresponding to the extracted event.

According to an embodiment of the present invention, the at least one event to be detected may include an event is selected from at least one predefined event by a user.

According to an embodiment of the present invention, the at least one event to be detected may include a user customized event inputted by the user.

According to an embodiment of the present invention, the user customized event may include a logical combination of the predefined event.

According to an embodiment of the present invention, the predefined event may include input/output event, communication event, diagnostic event, system error event, system idle event.

According to an embodiment of the present invention, the at least one event handler program section may include a predefined event handler program section.

According to an embodiment of the present invention, the at least one event handler program section may include a user customized event handler program section inputted by a user.

According to an embodiment of the present invention, a corresponding predefined event handler program section may be replaced by a user customized event handler program section in the program memory.

According to an embodiment of the present invention, the event queue may include a plurality of event queues with different priority levels, the event detector may register a priority level of the event to be detected, and add the detected event into a corresponding event queue according to the priority level of the event, the event detector may preferentially extract an event from an event queue with a high priority level.

According to an embodiment of the present invention, the event detector may discard a detected event if the event is already in the event queue.

According to the invention, the programming method according to scan cycle is replaced by an event-driven programming method in programmable logic controller, user application is split into event handler program sections with single function, the difficulty of user application programming and the probability of error are reduced, resulting in a well-structured user application with easy maintenance Meanwhile, as handling may be performed in time with respect to specific events, response speed and system performance are improved.

BRIEF DESCRIPTION OF THE DRAWINGS

For a more complete understanding of the present invention, reference is now made to the detailed description of the exemplary embodiment taken in conjunction with the accompanying drawings. It is to be clearly understood that the exemplary embodiment is only described by way of illustration and example, while the present invention is not limited thereto. The spirit and scope of the present invention is limited by the specific contents of the appended claims. The following describes the brief description of the drawings, including:

DETAILED DESCRIPTION

Figure 1:
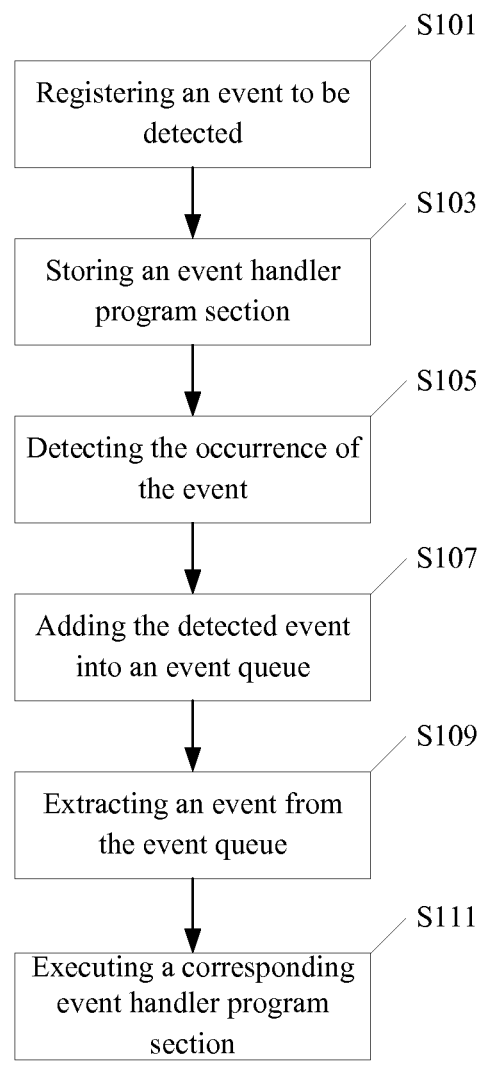
FIG. 1 is a flowchart illustrating an event-driven programming method of programmable logic controller according to an embodiment of the present invention.

FIG. 1 is a flowchart illustrating an event-driven programming method of programmable logic controller according to an embodiment of the present invention.

Referring to FIG. 1, in step S101, at least one event to be detected is registered in the programmable logic controller. According to an embodiment, a plurality of predefined events, such as input/output event, communication event, diagnostic event, system error event, system idle event and so on, may be predefined, thereby an interested event may be selected as the event to be detected from these predefined events. In addition, as a complement to the predefined events, the user may also input an user customized event as the event to be detected. The user customized event may be a logical combination of the predefined events. For example, assuming that the predefined events comprise: (E1) an input channel 1 receives data; (E2) a network port receives a message; and (E3) system is idle, then the following user customized events may be defined: E1 AND E3, namely, the input channel 1 receives data and system is idle; Or E2 OR E3, namely, the network port receives message or the system is idle. However, the user customized event of the present invention is not limited to the logical combination of the predefined events, it may also be defined by the user according to the actual requirements.

In step S103, a corresponding event handler program section is stored for each of the events to be detected in the programmable logic controller. According to an embodiment, several predefined event handler program sections may be predefined for default handling of the events. However, when an event has no corresponding predefined event handler program section or requires special handling, a user customized event handler program section may be inputted. When the user input a user customized event handler program section for an event to be detected, if the corresponding predefined event handler program section exists, then the predefined event handler program section may be replaced with the inputted user customized event handler program section.

In step S105, the occurrence of the events to be detected is detected in the programmable logic controller.

In step S107, a detected event is added into an event queue of the programmable logic controller. According to an embodiment, if the detected event is already in the event queue, then the event may be discarded. However, the present invention is not limited thereto. Alternatively, a duplicate event may also be recorded in the event queue.

In step S109, an event is extracted from the event queue.

In step S111, executing an event handler program section corresponding to the extracted event, which is stored in the programmable logic controller.

Figure 2:
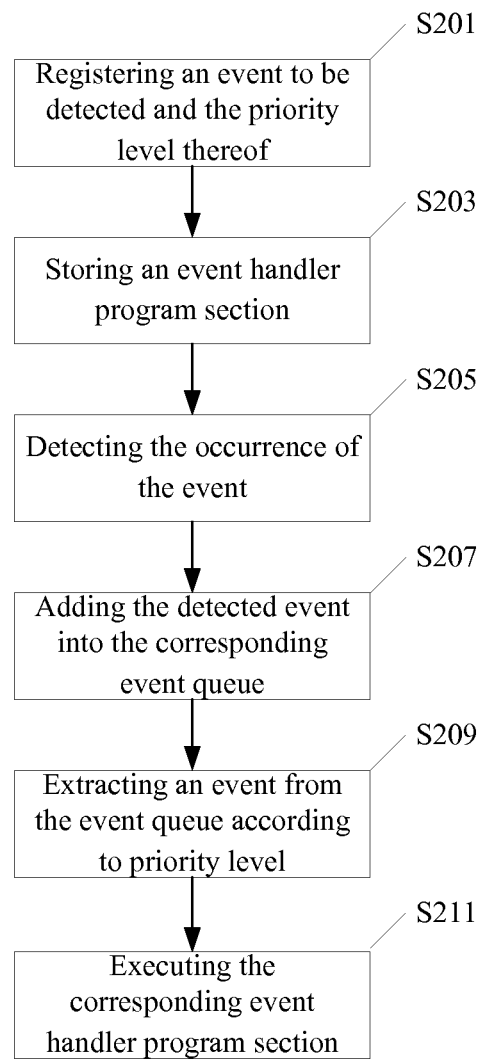
FIG. 2 is a flowchart illustrating an event-driven programming method of programmable logic controller according to another embodiment of the present invention.

FIG. 2 is a flowchart illustrating an event-driven programming method of the programmable logic controller according to another embodiment of the present invention. The difference between the embodiment and the embodiment of FIG. 1 is mainly in that a plurality of event queues with different priority levels are utilized to manage the queue.

Referring to FIG. 2, in step 201, at least one event to be detected and the priority level thereof are registered in the programmable logic controller.

In step S203, a corresponding event handler program section for each event to be detected is stored in the programmable logic controller.

In step S205, the occurrence of the events to be detected is detected in the programmable logic controller.

In step S207, a detected event is added into the event queue according to the priority level thereof.

In the step S209, an event is extracted from the event queue according to the priority level, when an event queue with higher priority level is not empty, an event is preferentially extracted from the event queue with higher priority level. Namely, the event queue with the highest priority level is handled first, and the event with the second highest priority level is handled, and so on.

In step S211, an event handler program section stored in the programmable logic controller corresponding to the extracted event is executed.

Figure 3:
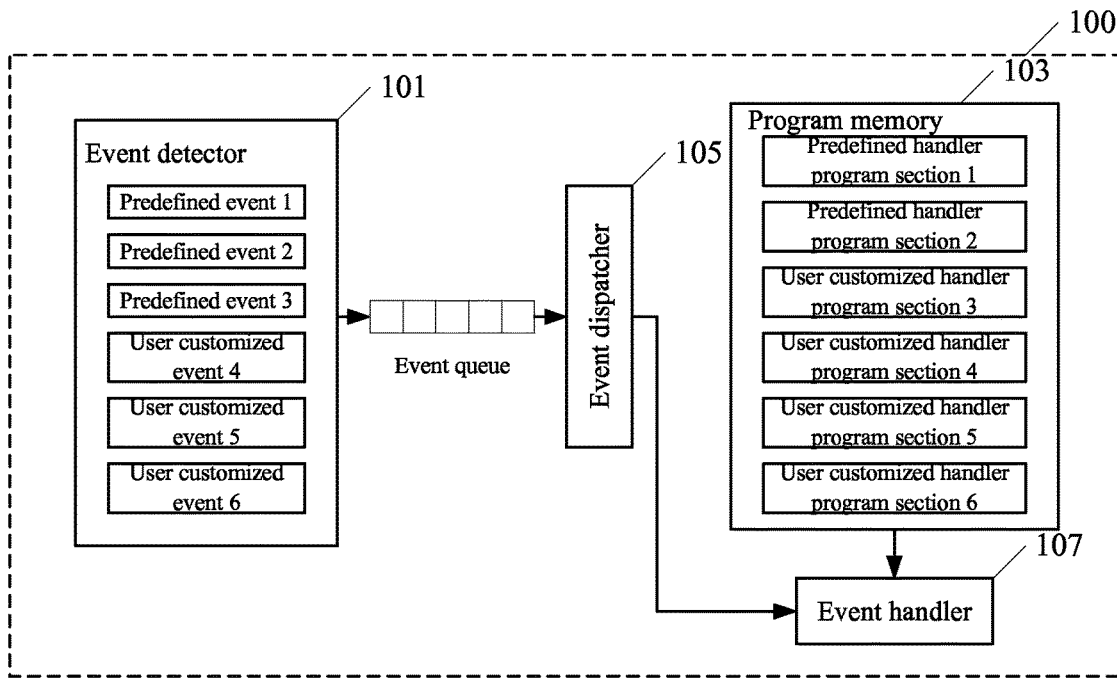
FIG. 3 is a block diagram illustrating a programmable logic controller according to an embodiment of the present invention.

FIG. 3 is a block diagram of a programmable logic controller 100 based on an embodiment of the present invention.

Referring to FIG. 3, the programmable logic controller 100 comprises an event detector 101, a program memory 103, an event dispatcher 105, an event handler 107 and an event queue used to store the events to be handled.

The event detector 101 registers at least one event to be detected, detects the occurrence of the event to be detected, and adds an detected event into the event queue. According to an embodiment, an event existing in the event queue may be discarded or recorded in duplicate. According to an embodiment, the events to be detected may comprise predefined events and user customized events inputted by user. A user customized event may be a logical combination of predefined events, or may be defined by the user himself according to actual needs.

Program memory 103 stores event handler program sections corresponding to the events to be detected, respectively. According to an embodiment, the event handler program sections may comprise predefined event handler program sections and user customized event handler program section, and a corresponding predefined event handler program section may be replaced with a user customized event handler program section.

The event dispatcher 105 extracts an event from the event queue and dispatches the event to the event handler 107.

The event handler 107 receives an event dispatched by the event dispatcher 105, and executes an event handler program section stored in the program memory 103 corresponding to the event.

Figure 4:
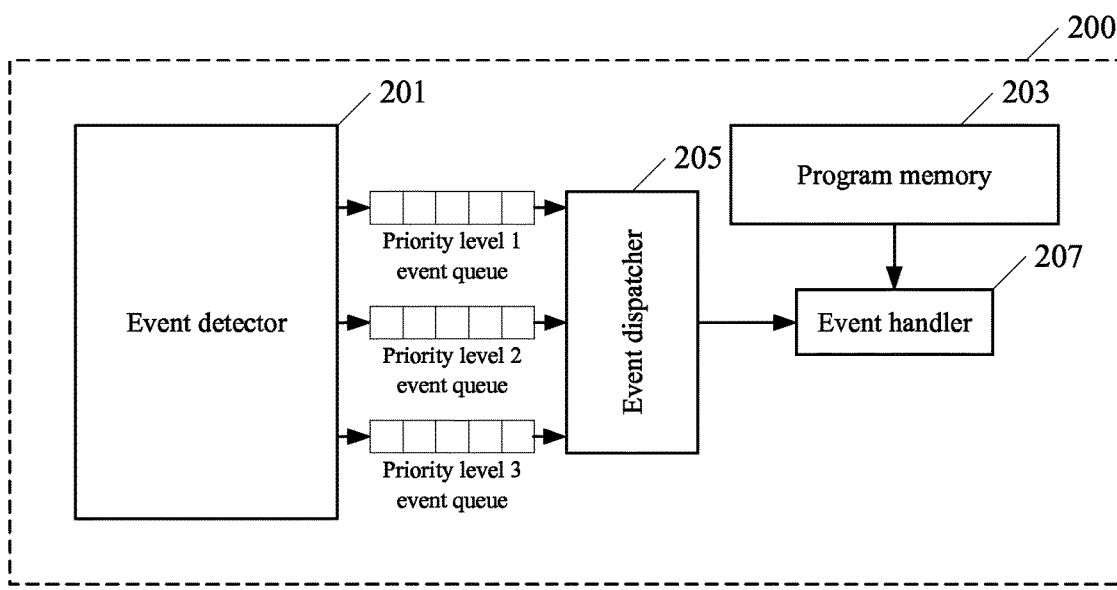
FIG. 4 is a bock diagram illustrating a programmable logic controller according to another embodiment of the present invention.

FIG. 4 is a block diagram of a programmable logic controller 200 based on another embodiment of the present invention. The difference the embodiment and the embodiment of FIG. 3 is in that a plurality of event queues with different priority levels are utilized to manage the queue.

Referring to FIG. 4, the programmable logic controller 200 comprises an event detector 201, a program memory 203, an event dispatcher 205, an event handler 207, and a plurality of event queues with distinct priority levels used for storing the event to be handled (for example, a priority level 1 event queue, a priority level 2 event queue, and a priority level 3 event queue).

The event detector 201 registers at least one event and the priority level thereof, detects the occurrence of the event to be detected, and adds a detected event into the event queue according to the priority level of the event.

The program memory 203 stores event handler program sections corresponding to the events to be detected, respectively.

The event dispatcher 205 extracts an event from the event queue according to the priority level and dispatches the event to the event dispatcher 207, when an event queue with higher priority level is not empty, an event is preferentially extracted from the event queue with higher priority level. Namely, the event queue with the highest priority level is handled first, and the event with the second highest priority level is handled, and so on.

The event handler 207 receives an event dispatched by the event dispatcher 205, and executes an event handler program section stored in the program memory 203 corresponding to the event.

While the invention has been shown and described with reference to certain embodiments thereof, it will be understood by those skilled in the art that various changes and modifications may be made therein without departing from the actual scope of the invention.

What is claimed is:

1. An event-driven method for programming a programmable logic controller, the method comprising:
    registering at least one event;
    storing at least one event handler program section corresponding to the at least one event;
    detecting an occurrence of the at least one event;
    adding the at least one event into an event queue of the programmable logic controller;
    extracting an event from the event queue; and
    executing an event handler program section corresponding to the extracted event,
    wherein registering the at least one event includes registering an event selected from at least one predefined event by a user, and registering a user-customized event input by a user, and
    wherein registering the user-customized event includes registering a logical combination of a plurality of predefined events including the at least one predefined event.

2. The method of claim 1, wherein registering the at least one predefined event includes registering at least one of an input/output event, a communication event, a diagnostic event, a system error event, and a system idle event.

3. The method of claim 1, wherein storing the at least one event handler program section includes storing a predefined event handler program section.

4. The method of claim 3, wherein storing the at least one event handler program section includes storing a user customized event handler program section inputted by a user.

5. The method of claim 4, further comprising replacing a corresponding predefined event handler program section with the user customized event handler program section.

6. The method of claim 1, wherein registering the at least one event includes registering at least one priority level of the at least one event, wherein adding the at least one event into the event queue includes adding the at least one event into at least one of a plurality of event queues based on a priority level of the event, and wherein extracting the event from the event queue includes extracting the event from the event queue based on the event queue having a higher priority level than other populated event queues of the plurality of event queues.

7. The method of claim 1, wherein adding the detected event into the event queue includes discarding a detected event if the detected event is already in the event queue.

8. A programmable logic controller comprising:
    an event queue configured to store events;
    an event detector configured to:
        register at least one event;
        detect an occurrence of the at least one event; and
        add the at least one event into the event queue;
    a program memory configured to store at least one event handler segment corresponding to the at least one event;
    an event dispatcher configured to extract an event from the event queue; and
    an event handler configured to execute an event handler program section corresponding to the extracted event,
        wherein the at least one event includes an event selected by a user from at least one predefined event, and a user-customized event inputted by a user, and
        wherein the user-customized event includes a logical combination of a plurality of predefined events including the at least one predefined event.

9. The programmable logic controller of claim 8, wherein the at least one predefined event includes at least one of an input/output event, a communication event, a diagnostic event, a system error event, and a system idle event.

10. The programmable logic controller of claim 8, wherein the at least one event handler program section includes a predefined event handler program section.

11. The programmable logic controller of claim 10, wherein the at least one event handler program section includes a user customized event handler program section inputted by a user.

12. The programmable logic controller of claim 11, wherein a corresponding predefined event handler program section is replaced by a user customized event handler program section in the program memory.

13. The programmable logic controller of claim 8, wherein the event queue includes a plurality of event queues having a plurality of different priority levels, wherein the event detector is configured to register at least one priority level of the at least one event and add the at least one event into at least one event queue of the plurality of event queues based on the at least one priority level of the at least one event, and wherein the event dispatcher is configured to extract the event from the event queue based on the event queue having a priority level higher than other event queues of the plurality of event queues.

14. The programmable logic controller of claim 8, wherein the event detector is further configured to discard the at least one event if the at least one event is already in the event queue.

* * * * *